Aug. 18, 1959 B. GOLDSTEIN 2,900,286

METHOD OF MANUFACTURING SEMI-CONDUCTIVE BODIES

Filed Nov. 19, 1957

INVENTOR.
BERNARD GOLDSTEIN
BY [signature]
ATTORNEY

United States Patent Office 2,900,286

Patented Aug. 18, 1959

2,900,286

METHOD OF MANUFACTURING SEMI-CONDUCTIVE BODIES

Bernard Goldstein, Princeton, N.J., assignor to Radio Corporation of America, a corporation of Delaware Application November 19, 1957, Serial No. 697,416

17 Claims. (Cl. 148—1.5)

This invention relates to improved methods of making semiconductor devices. More particularly, it relates to improved methods of forming PN junctions in compound semiconductors.

Certain semiconductive compounds exhibit useful electrical properties. One such class of compounds includes the phosphides and arsenides of aluminum, gallium and indium. Members of this class are known as III—V compounds, since each contains a constituent element from group III and a constituent element from group V of the periodic table. Some of the constituents of this class are volatile, for example phosphorus and arsenic. Another useful class of compounds includes the sulfides of zinc and cadmium. These are known as II—VI compounds, since each contains at least one constituent element from the group II and at least one constituent element from group VI of the periodic table. In all the compounds mentioned, the non-metallic element is considerably more volatile than the metallic element.

Semiconductive devices have been fabricated by introducing rectifying barriers, also known as PN junctions, in wafers of compound materials such as the phosphides, arsenides and sulfides mentioned above. PN junctions have been introduced in these materials by several methods. One method is the surface alloy process, in which a pellet of a material that induces conductivity of given type is alloyed to the surface of an opposite conductivity type wafer of the semiconductive compound. Conductivity type-determining materials are also known as impurities, or doping agents.

An object of the invention is to provide improved methods of making improved semiconductor devices;

Another object is to provide improved PN junctions in semiconductor devices;

Still another object is to provide an inexpensive method of fabricating semiconductor devices from semiconductive compounds;

Yet another object is to provide a rapid and simple method of introducing PN junctions in semiconductive compounds;

But another object is to provide a method of introducing a rectifying barrier in a semiconductive device and forming an ohmic contact to the device in a single operation.

These and other objects are accomplished by the instant invention, which provides an improved method of introducing rectifying barriers in semiconductive compounds which contain a volatile non-metallic element as one constituent. In a preferred form of the invention, wafers of given conductivity type are prepared from an ingot of one of the semiconductive compounds which consist of at least one metallic element and at least one volatile non-metallic element. Each wafer is heated in a suitable ambient to a temperature below the melting point of the compound, but above the temperature at which the compound appreciably dissociates or decomposes. The ambient atmosphere utilized contains vapors of a substance which induces predetermined conductivity type in the wafer. The predetermined conductivity type may for example be of type opposite to that of the wafer, or may be of the same type but different conductivity. The heat treatment volatilizes the non-metallic element or elements from the wafer surface, leaving a layer of the metallic element or elements on the surface. This layer may be molten, depending on the melting point of the element and the temperature to which the compound is heated. The type-determining substance which is present in the ambient atmosphere dissolves in the molten metal layer on the wafer surface until the saturation point, and diffuses from the molten layer into the adjacent surface region of the wafer, thus converting the region to the predetermined conductivity type. A PN barrier is formed between the bulk of the wafer, which is of given conductivity type, and the diffused region of predetermined conductivity type. On cooling, the molten layer solidifies and forms an electrode contact to the wafer.

The invention and its features will be more fully described by the following detailed description, in conjunction with the drawing, wherein.

Similar reference numerals are applied to similar elements throughout the drawing.

Figures 1, 2, 3, 4, 5, 6:
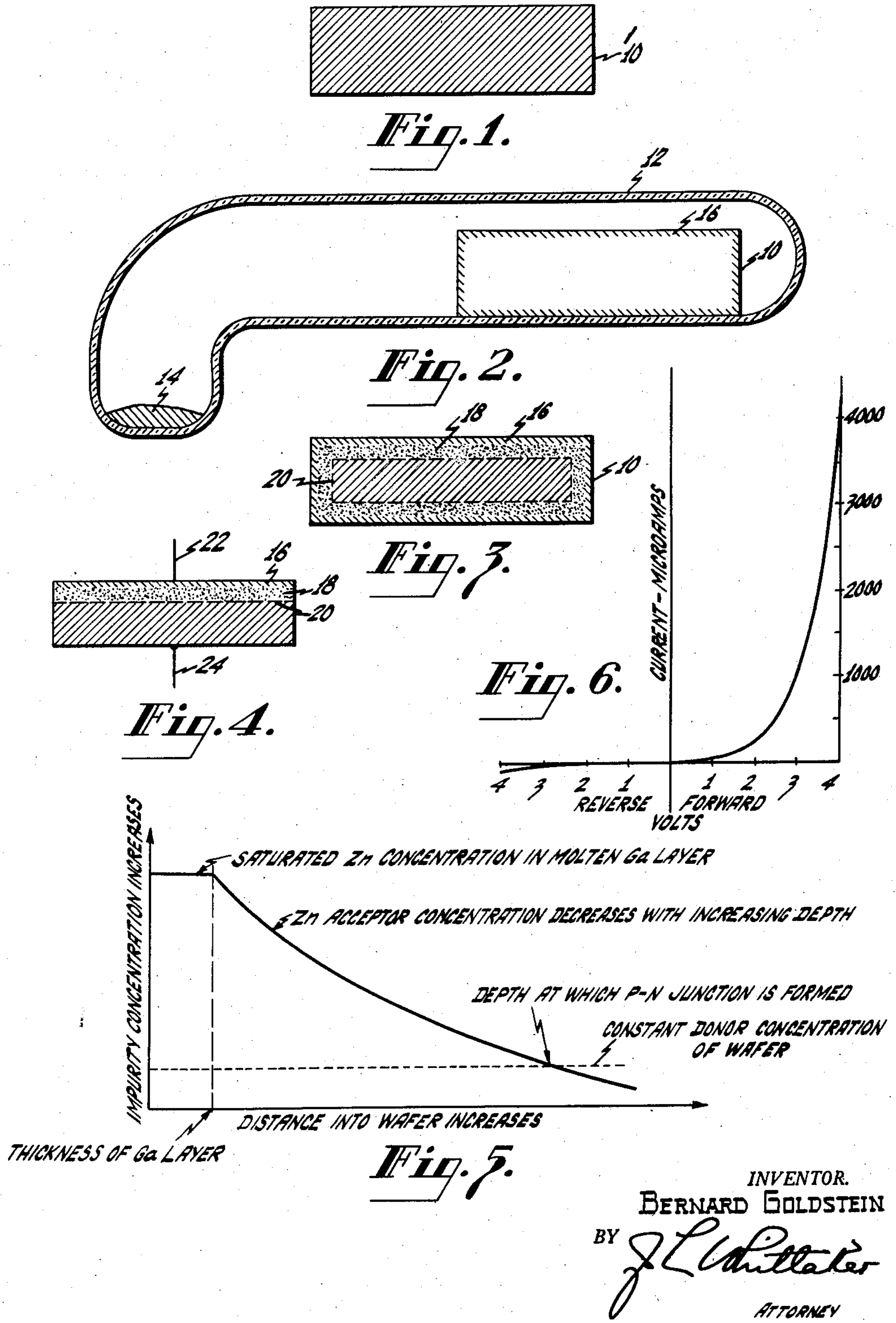
Figures 1–4 are sectional elevational views showing successive steps in the fabrication of a semiconductor device in accordance with the method of this invention.
Figure 5 is a schematic diagram showing the relation between original concentration of donors or acceptors in the compound, the concentration of the diffused type-determining substance, and the depth at which the PN junction is formed.
Figure 6 is a graph of the current-voltage characteristic of a PN junction device in accordance with one embodiment of this invention.

A preferred example of a method within the scope of the present invention will now be given.

Referring to Figure 1, a wafer 10 is prepared from a given conductivity type ingot of a semiconductive compound which contains a volatile non-metallic element as one constituent, and a relatively non-volatile metal as another constituent. Examples of such compounds are the III—V and II—VI compounds mentioned above. These materials may be prepared by direct synthesis from the elements. For example, stoichiometric amounts of the purified elements may be melted together in a sealed tube. As prepared, these compounds are usually of N-conductivity type, due to deviations from stoichiometry, or to various impurities in the starting materials. P-type III—V compounds may be prepared by adding to the melt a small amount of an acceptor impurity such as zinc or cadmium. If an N-type III—V compound is desired, a small amount of a donor impurity such as selenium or tellurium is added to the melt. Suitable acceptors for the II—VI compounds are sodium and potassium, while suitable donors include bromine and iodine. In this example, the wafer 10 consists of gallium arsenide containing excess negative charge carriers so as to be of N-conductivity type. The excess negative charge carrier (electron) concentration of the wafer may be about $10^{14}$ to $10^{17}$ per cc. In this example, the net electron concentration of the wafer 10 is $4 \times 10^{16}$ per cc.

Referring to Figure 2, the wafer 10 is placed at one end of an ampule or tube 12 which contains a quantity of an acceptor 14 such as zinc at the other end. The ampule 12, which may for example be fused quartz, is then exhausted and sealed. The ampule 12 is next placed in a two-zone furnace (not shown) so that the zinc 14 is in the cooler portion of the furnace, while the wafer 10 is in the hotter portion of the furnace. In this example, the cooler zone of the furnace is maintained at about 500° C., which is above the melting point of zinc. The tube 12 is thus filled with zinc vapor. The hotter zone of the furnace is maintained at about 850° C. As the temperature of the wafer 10 rises above 700° C., the gallium arsenide begins to decompose into gallium and arsenic. The arsenic has a relatively low boiling point of about 615° C., and hence is volatilized. The arsenic tends to deposit on the cooler portions of the tube 12. The gallium which remains on the surface of the wafer 10 forms a molten layer 16, since it has a melting point of about 30° C. However, as gallium has a boiling point of about 1700° C., it is not volatilized at the temperature maintained in the furnace. Heating is continued until the molten gallium layer 16 becomes saturated with zinc atoms from the surrounding ambient. In this example, the N-type gallium arsenide wafer is heated about 60 minutes at about 850° C. During this period, the zinc atoms diffuse from the gallium surface layer 16 into the adjacent region of the wafer 10. In this example, the resulting diffusion of zinc into the wafer causes the formation of a PN junction at a depth of about 4 mils.

Referring to Figure 3, the wafer 10 is cooled to room temperature so that the molten gallium layer 16 solidifies. The wafer region 18 which is adjacent to the indium layer 16 is converted to P-conductivity type by the zinc which has diffused therein from layer 16. A PN junction 20 is thus formed at the boundary between the P-type region 18 and the N-type bulk of the wafer. The gallium layer 16 forms a good ohmic contact to the wafer 10 via the P-type region 18, and thus facilitates device fabrication.

Referring to Figure 4, the wafer 10 is reduced by etching or grinding so as to remove the gallium layer 16, the P-type region 18, and the PN junction 20 from all but one of the wafer faces. A lead wire 22, which may for example consist of copper, is ohmically attached to the gallium layer 16. Another lead wire 24 which may for example consist of tungsten or platinum, is ohmically soldered to the wafer 10. This connection may conveniently be made coaxially to lead 22 but on the opposite face of the wafer. The device may then be encapsulated and cased by conventional methods known in the art. The device may be utilized as an active photovoltaic element if desired. When illuminated by a microscope lamp, a gallium arsenide unit made as in Figure 4 exhibited an open circuit voltage of 550 millivolts and a short circuit current of 800 microamperes.

The formation of a rectifying barrier by the method of this invention may be understood by reference to Figure 5, in which the concentration of type-determining impurity (zinc in this example) is shown for increasing depth into the wafer. The first flat portion of the curve shows that the impurity (zinc) concentration is high and constant in the molten gallium layer, which is practically saturated with zinc. The vertical dashed line represents the interface between the molten gallium and the bulk of the wafer. The zinc acceptor concentration declines with increasing distance into the wafer, falling off according to an error function curve. The horizontal dotted line represents the concentration of donors (or electrons) in the wafer. At the point P where the acceptor impurity concentration curve crosses the horizontal dot line, the concentration of acceptors is equal to the concentration of donors. The point P thus indicates the depth at which the PN junction is formed within the wafer.

Figure 6 is a diagram of the current-voltage characteristic of the device shown in Figure 4. Since the device contains a single PN junction, it is of the type known as rectifying diodes. The curve shown is characteristic of such single-junction rectifiers. The ratio of the forward current to the reverse current is about 80 to 1 at 4 volts. Even better performance can be obtained by ameliorating techniques, such as cleaning the device surfaces in a suitable etchant.

It will be understood that many variations are possible in the practice of the invention. For example, with N-type wafers of the III—V compounds, the ambient atmosphere utilized may consist of cadmium, mercury and magnesium in place of zinc. Rectifying barriers may be introduced in P-type wafers of the III—V compounds by utilizing as the ambient vapors of selenium or tellurium. Similarly, P-type wafers of the II—VI compounds may be treated in an ambient containing vapors of sodium or potassium, while with N-type wafers of the II—VI compounds bromine and iodine may be utilized as the ambient.

The process of this invention is not limited to a single temperature. The method can be carried out at any temperature between the onset of the dissociation of the compound and the melting point of the compound. Another feature of this invention is that an ohmic metal-to-semiconductor contact is automatically established when the wafer is cooler.

The process of this invention is not limited to a single temperature. The method can be carried out at any temperature between the onset of the dissociation of the compound and the melting point of the compound. Another feature of this invention is that an ohmic metal-to-semiconductor contact is automatically established when the wafer is cooled.

What is claimed is:

1. The method of forming a rectifying barrier in a given conductivity type wafer of a semiconductive compound, said compound containing a metallic element and a non-metallic element, said non-metallic element being more volatile than said metallic element, comprising heating said wafer to a temperature below the melting point of said compound but above the temperature at which the compound appreciably decomposes so as to volatilize said non-metallic element from the wafer surface and leave a layer of said metallic element on said surface, said heating being performed in an atmosphere of a substance which induces opposite conductivity type in said wafer, and being performed for a period of time sufficient for said substance to diffuse into the region of said wafer adjacent said metallic layer, then cooling said wafer.

2. The method of introducing a PN junction in a given conductivity type wafer of a semiconductive compound having a metallic element and a non-metallic element, said compound being selected from the group consisting of the phosphides and arsenides of aluminum, gallium, and indium, and the sulfides of zinc and cadmium, comprising heating said wafer to a temperature below the melting point of said compounds but above the dissociation temperature of said compound so as to drive off said non-metallic element from the wafer surface and leave a molten layer of said metallic element on said surface, said heating being performed in an atmosphere of a substance which induces opposite conductivity type in said wafer, and being continued for a period time sufficient for said substance to saturate said molten layer and diffuse into the region of said wafer adjacent said molten layer so as to form a PN junction between said diffused region and the remainder of said wafer, then cooling said wafer.

3. The method of forming a rectifying barrier in a given conductivity type wafer of a semiconductive compound, said compound having a less volatile element and a more volatile element, comprising heating said wafer to a temperature below the melting point of said compound but sufficiently high to drive off a quantity of said more volatile element from the wafer surface and leave a molten layer of said less volatile element on said surface, said heating being performed in an atmosphere of a substance that induces opposite conductivity type in said wafer, and being performed for a period of time sufficient for said substance to saturate said molten layer and diffuse into the region of said wafer adjacent said molten layer so as to form a rectifying barrier between said diffused region and the remainder of said wafer, then cooling said wafer so that said molten layer of said less volatile element solidifies.

4. The method of forming a rectifying barrier in a semiconductive wafer of given conductivity type, said wafer consisting of a compound of a metallic element and a non-metallic element, said non-metallic element being more volatile than said metallic element, comprising masking all but one of the faces of said wafer, heating said wafer to a temperature below the melting point of said compound but above the temperature at which the compound appreciably decomposes so as to volatilze said non-metallic element from the wafer surface and leave a molten layer of said metallic element on said surface, said heating being performed in an atmosphere of a substance which induces opposite conductivity type in said wafer, and being performed for a period of time sufficient for said substance to saturate said molten layer and diffuse into said unmasked wafer face adjacent said molten layer so as to form a rectifying barrier beneath said unmasked face between the diffused region and the remainder of said wafer, then cooling said wafer so that the surface layer of said metallic element solidifies.

5. The method of introducing a PN junction in a semiconductive wafer of given conductivity type, said wafer consisting of a compound of a metallic element and a non-metallic element, said compound being selected from the group consisting of the phosphides and arsenides of aluminum, gallium, and indium, and the sulfides of zinc and cadmium, comprising masking said wafer so as to expose only a predetermined portion of one surface, heating said wafer to a temperature below the melting point of said compound but above the dissociation temperature of said compound so as to drive off said non-metallic element from the unmasked wafer surface and leave a molten layer of said metallic element on said surface, said heating being performed in an atmosphere of a substance which induces opposite conductivity type in said wafer, and being continued for a period of time sufficient for said substance to saturate said molten layer and diffuse into the unmasked portion of said wafer adjacent said molten layer so as to form a PN junction beneath the unmasked portion of the wafer between the diffused region and the remainder of said wafer, then cooling said wafer so that the surface layer of said metallic element solidifies.

6. The method of introducing a PN junction in an N-conductivity type semiconductive wafer, said wafer consisting of a binary compound of one metallic element and one non-metallic element, said compound being selected from the group consisting of the phosphides and arsenides of aluminum, gallium, and indium, comprising masking said wafer so as to expose only a predetermined portion of one surface, heating said wafer to a temperature below the melting point of said compound but above the dissociation temperature of said compound so as to drive off said non-metallic element from the unmasked wafer surface and leave a molten layer of said metallic element on said surface, said heating being performed in an atmosphere of a conductivity type-determining substance selected from the group consisting of zinc and cadmium, said heating being continued for a period of time sufficient for said substance to saturate said molten layer and diffuse into the unmasked portion of said wafer adjacent said molten layer so as to form a PN junction beneath the unmasked portion of the wafer between the diffused region and the remainder of said wafer, then cooling said wafer so that said molten layer of said metallic element solidifies.

7. The method of forming a rectifying barrier in an N-conductivity type wafer of semiconductive indium phosphide, comprising masking all but one of the faces of said wafer, heating said wafer to a temperature below the melting point of said compound but above the temperature at which the compound appreciably decomposes so as to volatilize phosphorus from the unmasked wafer face and leave a molten layer of indium on said face, said heating being performed in an atmosphere of zinc, and being performed for a period of time sufficient for said zinc to saturate said molten layer and diffuse into said unmasked wafer face adjacent said molten layer so as to form a rectifying barrier beneath said unmasked face between the diffused region and the remainder of said wafer, then cooling said wafer so that said molten indium layer solidifies.

8. The method of forming a rectifying barrier in an N-conductivity type wafer of semiconductive gallium arsenide, comprising masking all but one of the faces of said wafer, heating said wafer to a temperature below the melting point of said compound but above the temperature at which the compound appreciably decomposes so as to volatilize arsenic from the unmasked wafer face and leave a molten layer of gallium on said face, said heating being performed in an atmosphere of cadmium, and being performed for a period of time sufficient for said cadmium to saturate said molten layer and diffuse into said unmasked wafer face adjacent said molten layer so as to form a rectifying barrier beneath said unmasked face between the diffused region and the remainder of said wafer, then cooling said wafer so that said molten gallium layer solidifies.

9. The method of introducing a PN junction in a semiconductive wafer of P-conductivity type, said wafer consisting of a binary compound of one metallic element and one non-metallic element, said compound being selected from the group consisting of the phosphides and arsensides of aluminum, gallium, and indium, comprising masking said wafer so as to expose only a predetermined portion of one surface, heating said wafer to a temperature below the melting point of said compound but above the dissociation temperature of said compound so as to drive off said non-metallic element from the unmasked wafer surface and leave a molten layer of said metallic element on said surface, said heating being performed in an atmosphere of a substance selected from the group consisting of sulfur, selenium, and tellurium, said heating being continued for a period of time sufficient for said substance to saturate said molten layer and diffuse into the unmasked portion of said wafer adjacent said molten layer so as to form a PN junction beneath the unmasked portion of the wafer between the diffused region and the remainder of said wafer, then cooling said wafer so that said molten layer of said metallic element solidifies and forms a non-rectifying connection to said adjacent diffused region of said wafer.

10. The method of forming a rectifying barrier in a P-conductivity type wafer of indium phosphide, comprising masking all but one of the faces of said wafer, heating said wafer to a temperature below the melting point of indium phosphide but above the temperature at which it appreciably decomposes so as to volatilize the phosphorus from the exposed wafer face and leave a molten layer of indium on said face, said heating being performed in an atmosphere of sulfur, and being performed for a period of time sufficient for said sulfur to saturate said molten indium layer and diffuse into said unmasked wafer face adjacent said molten layer so as to form a rectifying barrier beneath said unmasked face between the diffused region and the remainder of said wafer, then cooling said wafer to that said molten indium layer solidifies and forms an ohmic contact to said adjacent diffused region of said wafer.

11. The method of forming a rectifying barrier in a P-conductivity type wafer of gallium arsenide, comprising masking all but one of the faces of said wafer, heating said wafer to a temperature below the melting point of gallium arsenide but above the temperature at which it appreciably decomposes so as to volatilize arsenic from the exposed wafer face and leave a molten layer of gallium on said face, said heating being performed in an atmosphere of selenium, and being performed for a period of time sufficient for said selenium to saturate said molten gallium layer and diffuse into said unmasked wafer face adjacent said molten layer so as to form a rectifying barrier beneath said unmasked face between the diffused region and the remainder of said wafer, then cooling said wafer so that said molten gallium layer solidifies and forms an ohmic contact to said adjacent diffused region of said wafer.

12. The method of introducing a PN junction in an N-conductivity type wafer of a semiconductive compound selected from the group consisting of zinc sulfide and cadmium sulfide, comprising masking said wafer so as to expose only a predetermined portion of one surface, heating said wafer to a temperature below the melting point of said compound but above the dissociation temperature of said compound so as to drive off sulfur from the wafer surface and leave a molten layer of the remaining element on said surface, said heating being performed in an atmosphere of a substance selected from the group consisting of lithium, sodium, and potassium, and being continued for a period of time sufficient for said substance to saturate said molten layer and diffuse into the unmasked portion of said wafer adjacent said molten layer so as to form a PN junction beneath the unmasked portion of the wafer between the diffused region and the remainder of said wafer, then cooling said wafer so that said molten layer solidifies and forms a non-rectifying connection to said adjacent diffused region of said wafer.

13. The method of forming a rectifying barrier in an N-conductivity type wafer of zinc sulfide, comprising masking all but one of the faces of said wafer, heating said wafer to a temperature below the melting point of said compound but above the temperature at which the compound appreciably decomposes so as to volatilize sulfur from the exposed wafer face and leave a molten layer of zinc on said face, said heating being performed in an atmosphere of sodium, and being performed for a period of time sufficient for said sodium to saturate said molten zinc layer and diffuse into the region of said unmasked wafer face adjacent said molten layer so as to form a rectifying barrier beneath said unmasked face between the diffused region and the remainder of said wafer, then cooling said wafer so that said molten zinc layer solidifies and forms an ohmic contact to said adjacent diffused region of said wafer.

14. The method of forming a rectifying barrier in an N-conductivity type wafer of cadmium sulfide, comprising masking all but one of the faces of said wafer, heating said wafer to a temperature below the melting point of said compound but above the temperature at which the compound appreciably decomposes so as to volatilize sulfur from the exposed wafer face and leave a molten layer of cadmium on said face, said heating being performed in an atmosphere of potassium, and being performed for a period of time sufficient for said potassium to saturate said molten cadmium layer and diffuse into the region of said unmasked wafer face adjacent said molten layer so as to form a rectifying barrier beneath said unmasked face between the diffused region and the remainder of said wafer, then cooling said wafer so that said molten cadmium layer solidifies and forms an ohmic contact to said adjacent diffused region of said wafer.

15. The method of introducing a PN junction in a semiconductive wafer of P-conductivity type, said wafer consisting of a compound selected from the group consisting of zinc sulfide and cadmium sulfide, comprising masking said wafer so as to expose only a predetermined portion of one surface, heating said wafer to a temperature below the melting point of said compound but above the dissociation temperature of said compound so as to drive off sulfur from the wafer surface and leave a molten layer of the remaining element on said surface, said heating being performed in an atmosphere of a substance selected from the group consisting of chlorine, bromine, and iodine, and being continued for a period of time sufficient for said substance to saturate said molten layer and diffuse into the unmasked portion of said wafer adjacent said molten layer so as to form a PN junction beneath the unmasked portion of the wafer between the diffused region and the remainder of said wafer, then cooling said wafer so that said molten layer of said metallic element solidifies and forms a non-rectifying connection to said adjacent diffused region of said wafer.

16. The method of forming a rectifying barrier in a P-conductivity type wafer of zinc sulfide, comprising masking all but one of the faces of said wafer, heating said wafer to a temperature below the melting point of zinc sulfide but above the temperature at which zinc sulfide appreciably decomposes so as to volatilize sulfur from the exposed wafer face and leave a molten layer of zinc on said face, said heating being performed in an atmosphere of chlorine, and being performed for a period of time sufficient for said chlorine to saturate said molten layer and diffuse into said unmasked wafer face adjacent said molten zinc layer so as to form a rectifying barrier beneath said unmasked face between the diffused region and the remainder of said wafer, then cooling said wafer so that said molten zinc layer solidifies and forms an ohmic contact to said adjacent diffused region of said wafer.

17. The method of forming a rectifying barrier in a P-conductivity type wafer of cadmium sulfide, comprising masking all but one of the faces of said wafer, heating said wafer to a temperature below the melting point of cadmium sulfide but above the temperature at which cadmium sulfide appreciably decomposes so as to volatilize sulfur from the exposed wafer face and leave a molten layer of cadmium on said face, said heating being performed in an atmosphere of bromine, and being performed for a period of time sufficient for said bromine to saturate said molten layer and diffuse into said unmasked wafer face adjacent said molten cadmium layer so as to form a rectifying barrier beneath said unmasked face between the diffused region and the remainder of said wafer, then cooling said wafer so that said molten cadmium layer solidifies and forms an ohmic contact to said adjacent diffused region of said wafer.

References Cited in the file of this patent

FOREIGN PATENTS

| | | |
|---|---|---|
| 1,129,505 | France | Jan. 22, 1957 |
| 1,129,941 | France | Jan. 29, 1957 |
| 784,431 | Great Britain | Oct. 9, 1957 |